United States Patent
Ogihara et al.

[11] Patent Number: 5,869,221
[45] Date of Patent: Feb. 9, 1999

[54] METHOD OF FABRICATING AN LED ARRAY

[75] Inventors: Mitsuhiko Ogihara; Yukio Nakamura; Takatoku Shimizu; Masumi Taninaka, all of Tokyo, Japan

[73] Assignee: Oki Electric Industry Co., Ltd., Tokyo, Japan

[21] Appl. No.: 997,735

[22] Filed: Dec. 24, 1997

Related U.S. Application Data

[62] Division of Ser. No. 611,410, Mar. 6, 1996, Pat. No. 5,733,689, which is a division of Ser. No. 326,498, Oct. 20, 1994, Pat. No. 5,523,590.

[30] Foreign Application Priority Data

Oct. 20, 1993 [JP] Japan ................................. 5-262817
Oct. 27, 1993 [JP] Japan ................................. 5-269249

[51] Int. Cl.$^6$ ...................................................... G03F 9/00
[52] U.S. Cl. .............................. 430/311; 430/313; 257/88
[58] Field of Search ................................. 430/311, 313, 430/314; 257/88

[56] References Cited

U.S. PATENT DOCUMENTS

| | | |
|---|---|---|
| 3,730,766 | 5/1973 | Nishimatsu et al. . |
| 3,745,428 | 7/1973 | Misawa et al. . |
| 4,127,792 | 11/1978 | Nakata . |
| 4,145,707 | 3/1979 | Sadamasa et al. . |
| 4,277,793 | 7/1981 | Webb . |
| 4,852,112 | 7/1989 | Kagawa et al. . |
| 5,309,001 | 5/1994 | Watanabe et al. . |

FOREIGN PATENT DOCUMENTS

| | | |
|---|---|---|
| 1 516 347 | 3/1968 | France . |
| 56-30776A | 3/1981 | Japan . |
| 2-63148 | 3/1990 | Japan . |
| 5-67807A | 3/1993 | Japan . |
| 5-190899 | 7/1993 | Japan . |

OTHER PUBLICATIONS

Nakamura et al., "Kotai Hakko Soshi to sono Oyo (Solid-State Light-Emitting Elements and their Applications)", Sampo, 1971, pp. 78–81.

Hashimoto et al., "Purazuma CVD SiOxNy Maku wo Mochiita Zn Sentaku Kakusan Gijutsu no Kaihatsu" (Development of Selective Zinc Diffusion Technology Using Plasma CVD SiOxNy Film), Oki Denki Kenkyu Kaihatsu (Oki Research and Development), vol. 52, No. 4, pp. 105–110, Oct. 1985.

*Primary Examiner*—S. Rosasco
*Attorney, Agent, or Firm*—VENABLE; Robert J. Frank; Ashley J. Wells

[57] ABSTRACT

A method of fabricating an LED array includes forming a first insulating film composed of aluminum oxide on a semiconductor substrate of a first conductive type; patterning the first insulating film by photolithography to form a plurality of first windows; diffusing an impurity of a second conductive type through the plurality of first windows into the first insulating film, thereby forming a plurality of diffusion regions of the second conductive type below the plurality of first windows; forming a second insulating film on the first insulating film and the plurality of first windows; patterning the second insulating film by photolithography to remove the second insulating film from the plurality of first windows, using an etchant that does not etch the first insulating film; forming a metal film on the second insulating film and the plurality of first windows; and patterning the metal film by photolithography to form a plurality of electrodes which make electrical contact with respective diffusion regions.

16 Claims, 9 Drawing Sheets

METHOD OF FABRICATING AN LED ARRAY

This is a division of application Ser. No. 08/611,410 filed Mar. 6, 1996 U.S. Pat. No. 5,733,689, which is a division of application Ser. No. 08/326,498 filed Oct. 20, 1994 now U.S. Pat. No. 5,523,590.

BACKGROUND OF THE INVENTION

This invention relates to an array of light-emitting diodes (hereinafter referred to as an LED array), and to a process for fabricating such an array with improved uniformity.

LED arrays are used, for example, to illuminate photosensitive drums in electrophotographic printers. The high density of diodes in the array and the need to obtain uniform optical output from each of the diodes makes the fabrication of LED arrays more difficult than the fabrication of individual light-emitting diodes.

One conventional fabrication method deposits an insulating film of aluminum oxide ($Al_2O_3$) on a wafer comprising an n-type semiconductor substrate; patterns the insulating film by photolithography to form an array of rectangular openings; diffuses a p-type impurity such as zinc through the openings to form an array of p-type diffusion regions in the n-type substrate, thereby creating pn junctions; then deposits an aluminum film on the entire wafer and patterns the aluminum to form a set of electrodes, one electrode making contact with each of the p-type diffusion regions. Each pn junction functions as a light-emitting diode (LED).

One problem encountered in this method is the occurrence of pinholes in the insulating film. A pinhole disposed below an electrode can short-circuit the electrode to the n-type substrate, so that current bypasses the corresponding light-emitting diode and no light is emitted from that diode. A pinhole occurring at the periphery of one of the openings in the insulating film can enlarge its light-emitting area; the underlying diode then differs from other diodes in the shape and power of its emitted light pattern. In a printer, pinholes result in missing or uneven dots.

A second problem concerns the patterning of the insulating film. The patterning process includes a wet etching step employing a liquid etchant, which is attracted by surface tension toward the corners of the rectangular pattern openings. Pooling of the etchant in the corners can lead to uneven etching, hence to uneven diffusion of the p-type impurity. If pooling causes over-etching of the insulating film between adjacent rectangular openings, for example, p-type diffusion bridges may form between adjacent diodes. Similar pooling can occur at corners of the patterns used to form the aluminum electrodes, leading to variability in the area occupied by different electrodes within the p-type diffusion regions. In a printer, these problems again result in uneven dots, or in fused dots.

A second conventional fabrication method seeks to solve these problems by employing a bi-layer insulating film, the lower layer comprising silicon nitride ($Si_3N_4$) and the upper layer silicon oxynitride ($SiO_xN_y$). Both layers are etched by a dry etching step employing a gaseous etchant, thereby avoiding the problem of pooling of a liquid etchant. As for pinholes, although pinholes may form at random locations in each layer, the probability that pinholes will occur at the same location in both layers is in theory very small.

In practice, however, this second conventional method does not eliminate the problem of pinholes, because when the insulating film is etched, there may be pinholes in the photoresist etching mask. Etchant gas will gain access through these pinholes to the upper layer, etch through the upper layer to the lower layer, then etch through the lower layer to the substrate. After the photoresist is removed, pinholes extending through both the upper and lower layers of the insulating film will be left.

Another problem with the second conventional method is that silicon nitride and silicon oxynitride give rise to greater internal stress than does aluminum oxide. Such internal stress can lead to cracking or flaking of the insulating film, resulting in a defective array.

SUMMARY OF THE INVENTION

It is accordingly an object of the present invention to avoid short circuits and nonuniform optical output caused by pin-holes in the insulating film of an LED array.

Another object of the invention is to avoid non-uniform etching due to pooling of liquid etchants in the fabrication process of an LED array.

According to a first aspect of the invention, to fabricate an LED array, a first insulating film is formed on a semiconductor substrate of a first conductive type. The first insulating film is patterned by photolithography to form a plurality of first windows through which an impurity of a second conductive type is diffused, creating a corresponding plurality of diffusion regions of the second conductive type in the substrate below. A second insulating film is formed on the first insulating film and patterned by photolithography, using an etchant that does not etch the first insulating film, to remove the second insulating film from the first windows. This avoids the formation of pinholes that extend through both the first and second insulating films. A metal film is deposited on the second insulating film and first windows, and patterned by photolithography to form electrodes making electrical contact with the diffusion regions.

According to a second aspect of the invention, the photolithography steps that pattern the first insulating film and metal film employ wet etching. The photomasks used in these photolithography steps have transparent and opaque areas with either rounded corners, or corners consisting of line segments meeting at obtuse angles. Such corners lead to more uniform wet etching, since etchant does not tend to pool in them.

DETAILED DESCRIPTION OF THE INVENTION

Embodiments of the invention will be described with reference to the attached drawings. These drawings illustrate the invention but do not define its scope, which should be determined solely from the appended claims.

Figure 1:
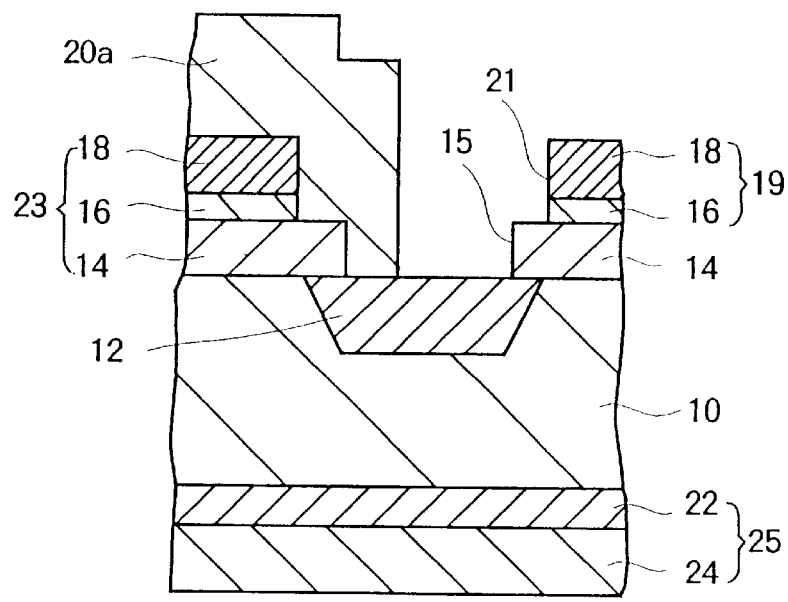
FIG. 1 is a sectional view of one LED in a novel LED array.

FIG. 1 shows a sectional view of one LED in a novel LED array. The array is formed in an n-type semiconductor substrate 10 comprising, for example, gallium arsenide doped with phosphorus (GaAsP). Each LED comprises a diffusion region 12, this being a region in which a p-type impurity such as zinc (Zn) has been diffused into the n-type substrate 10. The substrate 10 is covered by a first insulating film 14 of aluminum oxide ($Al_2O_3$) having a first window 15 disposed above the diffusion region 12. The first insulating film 14 is covered by a phospho-silicate glass (PSG) insulating film 16, which is in turn covered by an upper insulating film 18. The PSG insulating film 16 and upper insulating film 18 constitute a second insulating film 19. The first and second insulating films 14 and 19 constitute a multilayer insulating film 23.

An electrode lead 20a formed on the second insulating film 19 extends over the edge of a second window 21 in the second insulating film 19 and over the edge of the first window 15 in the first insulating film 14 to make electrical contact with the diffusion region 12 in the substrate 10. The second window 21 is aligned with the first window 15 but is slightly larger. The bottom surface of the substrate 10 is covered by a gold alloy film 22 and a gold film 24, these two films constituting a common electrode 25.

Figure 2:
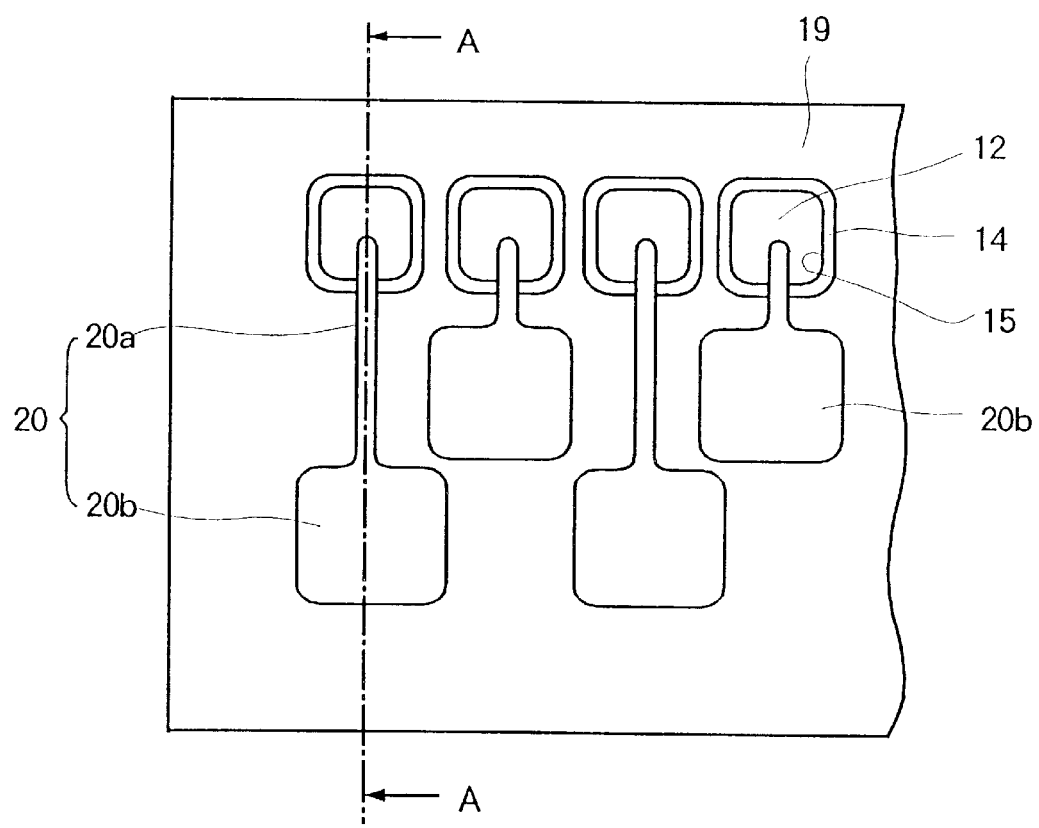
FIG. 2 is a plan view of the novel LED array.

FIG. 1 is a sectional view through line A—A in FIG. 2, which shows a plan view of part of the LED array as seen from above, looking down onto the surface of the second insulating film 19. In FIG. 2 a plurality of LEDs, each comprising one diffusion region 12, are disposed side-by-side. The diffusion regions 12 are exposed in the first windows 15. Each LED has its own electrode 20, comprising an electrode lead 20a and bonding pad 20b. Due to the close spacing of the LEDs, the bonding pads 20b are disposed in a staggered arrangement.

The patterns shown in FIG. 2, including the patterns of the first windows 15 and electrodes 20, all have rounded shapes without sharp corners. The purpose of this is to provide for better liquid etchant flow and avoid the etchant pooling that occurred in the prior art. Means of forming these rounded shapes will be described later.

The invented LED array operates in the conventional manner. The common electrode 25 is coupled to a ground potential, and a positive potential is supplied via bonding wires (not shown) to selected bonding pads 20b. Current flows through the electrode leads 20a to the corresponding diffusion regions 12, thence through the n-type substrate 10 and common electrode 25 to ground. The flow of current across the pn junction between the diffusion region 12 and substrate 10 is accompanied by the emission of light.

Next a novel fabrication method for this LED array will be described with reference to FIGS. 3 to 12.

Figure 3:
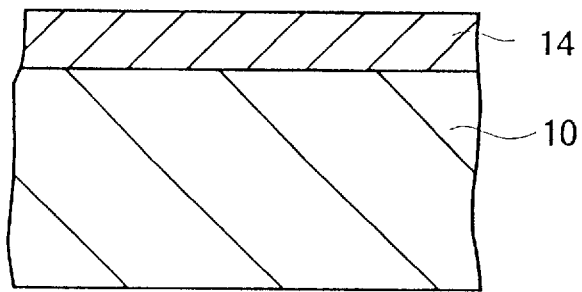
FIG. 3 illustrates a first step in a fabrication method for the novel LED array.

Referring to FIG. 3, the method starts from an n-type semiconductor substrate 10. The substrate is a GaAsP/GaAs wafer comprising a GaAs substrate layer, a GaAsP epitaxial layer, and one or more intermediate layers with compositions that change gradually from the substrate composition to the composition of the epitaxial layer, thereby facilitating alignment of the crystal structures of different layers. These substrate, intermediate, and epitaxial layers will be collectively referred to as the substrate 10.

Before any films are deposited, the surface of the substrate 10 is cleaned with a suitable fluid, then dried. Next aluminum oxide ($Al_2O_3$) is sputtered onto the substrate 10 to form the first insulating film 14, which has a thickness of about two hundred to three hundred nanometers (200 to 300 nm).

Figure 4:
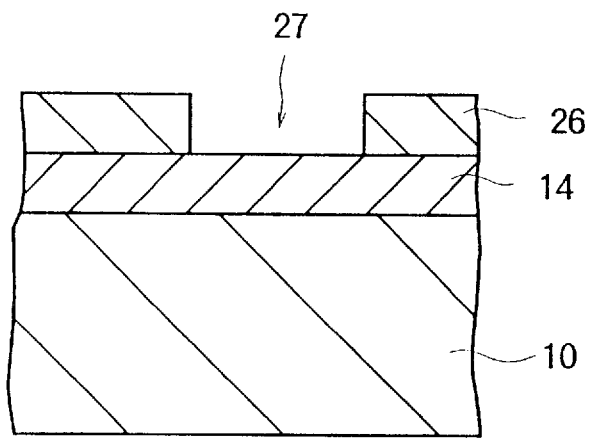
FIG. 4 illustrates a second step in the fabrication method.

Referring to FIG. 4, next the wafer is coated with a photoresist 26. This photoresist 26 is exposed to light through a photomask (shown Later), then developed with suitable chemicals to form windows 27.

Figure 5:
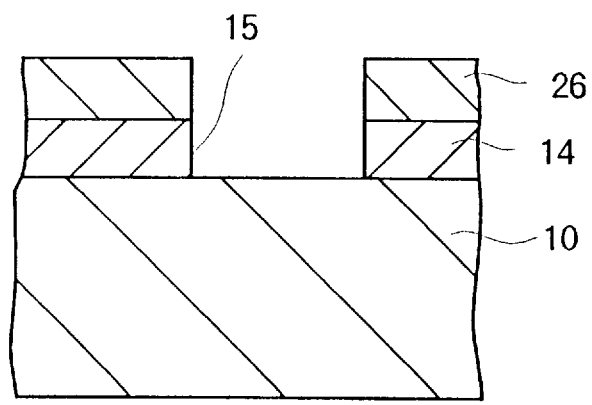
FIG. 5 illustrates a third step in the fabrication method.

Referring to FIG. 5, the wafer is now etched for two minutes with hot phosphoric acid, the etching temperature being eighty to eighty-five degrees Celsius (80° C. to 85° C.). Hot phosphoric acid is a liquid etchant that attacks the first insulating film 14 but not the photoresist 26; accordingly, first windows 15 are formed in the first insulating film 14 in the same locations as the windows 27 in FIG. 4.

Figure 6:
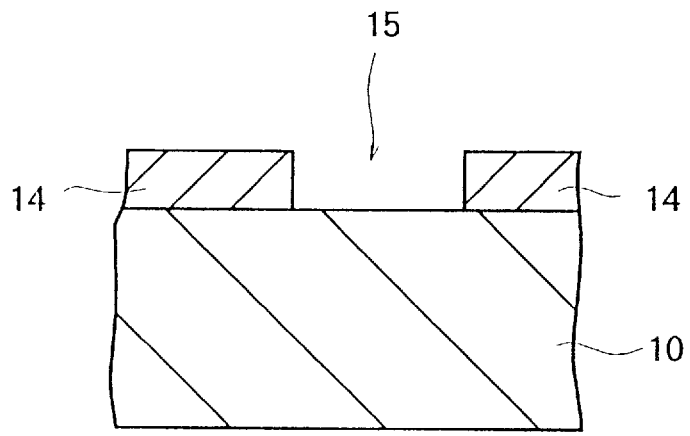
FIG. 6 illustrates a fourth step in the fabrication method.

Referring to FIG. 6, after the etching process, the remaining photoresist 26 is removed. The process illustrated in FIGS. 4 to 6 is a well-known type of photolithography process, in this case employing wet etching, i.e. using a liquid etchant.

Figure 7:
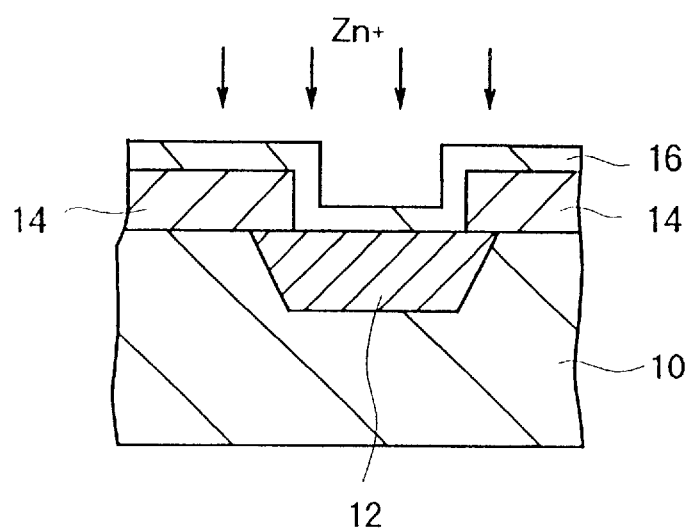
FIG. 7 illustrates a fifth step in the fabrication method.

Referring to FIG. 7, phospho-silicate glass is now deposited on the entire wafer, by chemical vapor deposition (CVD) for example, to form a PSG insulating film 16 with a thickness of 10 to 20 nm. The PSG insulating film 16 is preferably formed under conditions that give it an index of refraction of approximately 1.4. Zinc (Zn) is then diffused through the PSG insulating film 16 so that it penetrates into the substrate 10 below the first windows 15 and forms the diffusion regions 12. The PSG insulating film 16 protects the substrate 10 by preventing the evaporation of gallium, arsenic, or phosphorus atoms during this diffusion process.

The zinc diffusion process can be carried out in either a sealed or open chamber. If a sealed chamber is used, the diffusion is preferably carried out for six hours at a temperature of 700° C. to 800° C. The aluminum-oxide first insulating film 14 is known to prevent undue lateral diffusion of zinc during this diffusion process. One advantage of the invented fabrication method is that, while avoiding the pinhole problems of the prior art, it still permits the use of aluminum oxide, which has this desirable property of restricting lateral diffusion. This advantage is particularly important in high-density arrays.

After diffusion, the wafer is again cleaned and dried.

Figure 8:
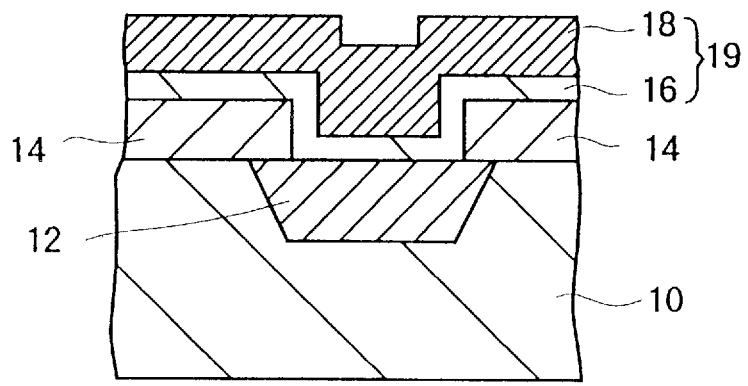
FIG. 8 illustrates a sixth step in the fabrication method.

Referring to FIG. 8, a layer of silicon nitride 18 is now deposited, by chemical vapor deposition for example, to form the upper insulating film 18. This film 18 has a thickness of approximately 100 nm.

Silicon oxynitride can be employed instead of silicon nitride, although with silicon oxynitride the deposition conditions must be carefully controlled to avoid deformation of the substrate, owing to the higher internal stresses associated with silicon oxynitride films. It is also possible to employ both silicon oxynitride and silicon nitride; for example, to first form a layer of silicon nitride, then form an additional layer of silicon oxynitride on top of the silicon nitride layer, so that the upper insulating film 18 itself has a bi-layer structure.

Figure 9:
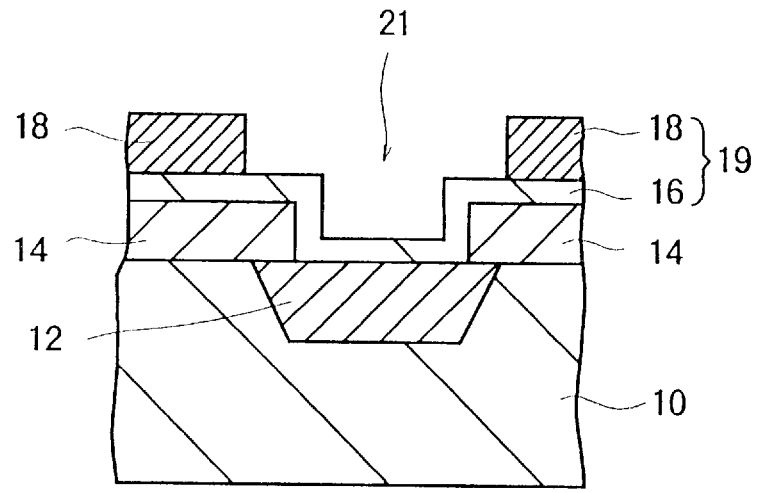
FIG. 9 illustrates a seventh step in the fabrication method.

Referring to FIG. 9, the upper insulating film 18 is now coated with a photoresist (not shown) and patterned by photolithography to form the second windows 21. The photolithography mask should be designed so that the second windows 21 are larger than the underlying first windows in the first insulating film 14.

This photolithography step employs a dry etching process that removes the upper insulating film 18 without removing the PSG insulating film 16 or first insulating film 14. For example, plasma etching can be employed with carbon tetrafluoride ($CF_4$) and oxygen ($O_2$) as the etchant gases, 250 watts of rf power being supplied to the plasma at a frequency of 13.56 megahertz. The etching time in this case is approximately two minutes. With these process parameters, the etching rate of silicon nitride is much higher than the etching rate of PSG or aluminum oxide, so while the upper insulating film 18 is removed in the areas of the second windows 21, the PSG insulating film 16 and first insulating film 14 are left substantially intact.

Figure 10:
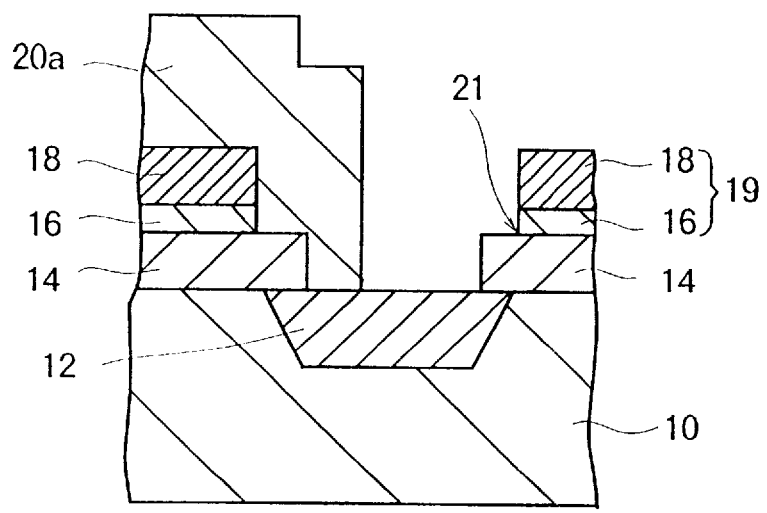
FIG. 10 illustrates an eighth step in the fabrication method.

Referring to FIG. 10, after the photoresist has been removed from the upper insulating film 18, the upper insulating film 18 is used as an etching mask for the PSG insulating film 16. The PSG insulating film 16 can be etched with, for example, buffered hydrofluoric acid (BHF), which does not readily etch the upper insulating film 18, first insulating film 14, or substrate 10. The PSG insulating film 16 is thereby removed from the second windows 21, so that the second windows 21 are extended through the PSG insulating film 16.

After the second windows 21 have been completed in this way, the wafer is coated with a metal film, more specifically an aluminum film, by the well-known electron-beam evaporation process, for example. The aluminum film is then patterned by photolithography to create the electrodes 20, of which one electrode lead 20a is shown in FIG. 10. This photolithography step employs a wet etching process that etches the aluminum and first insulating film 14 but does not etch the upper insulating film 18 or PSG insulating film 16. The reason for making the second windows 21 larger than the first windows 15 is to prevent the formation of gaps by over-etching of the first insulating film 14 adjacent the electrode leads 20a during this electrode photolithography step.

Figure 11:
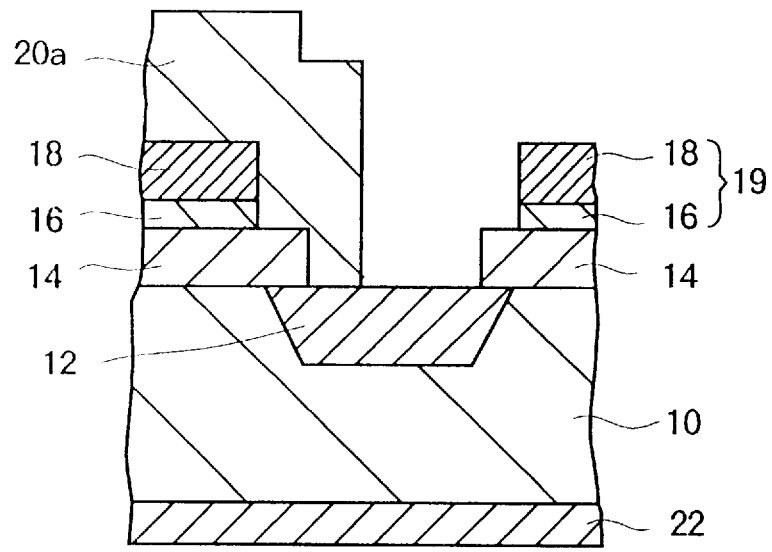
FIG. 11 illustrates a ninth step in the fabrication method.

Referring to FIG. 11, the lower surface of the wafer is now polished by suitable means, then an alloy of gold, germanium, and nickel is deposited by electron-beam evaporation to form the gold alloy film 22. The thickness of this film 22 should be 100 to 200 nm.

Figure 12:
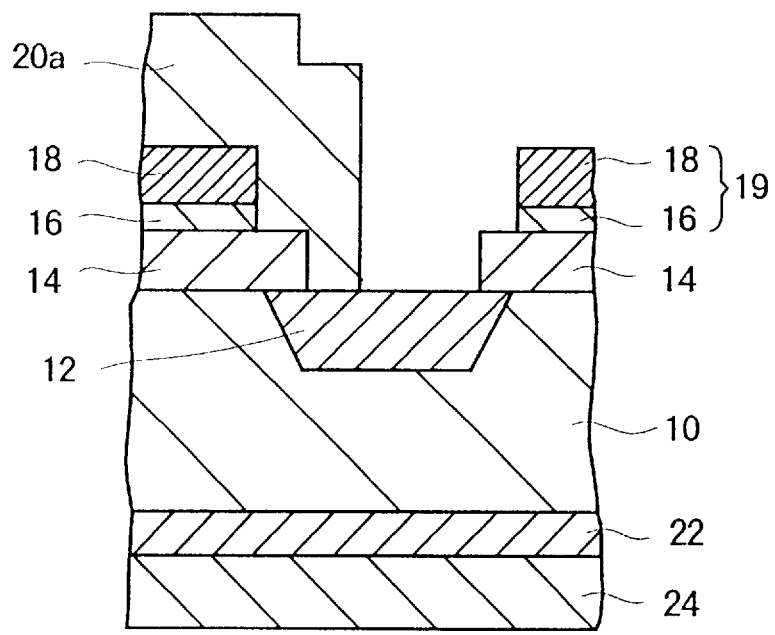
FIG. 12 illustrates a tenth step in the fabrication method.

Referring to FIG. 12, gold is next deposited on the gold alloy film 22 by electron-beam evaporation, forming the gold film 24. This completes the formation of the structure shown in FIG. 1.

Next a second embodiment of the invention will be described. Separate drawings will be omitted, because this embodiment is nearly identical to the first embodiment. The only difference is that the upper insulating film 18 comprises aluminum oxide instead of silicon nitride. The etching step illustrated in FIG. 9 is accordingly now a wet etching step, using hot phosphoric acid. Since this etchant does not etch the PSG insulating film 16, it does not reach the first insulating film 14. Accordingly, as in the first embodiment, the first insulating film 14 is not etched during either of the etching steps in the etching of the second insulating film 19.

An advantage of the second embodiment is that less internal stress occurs in an aluminum oxide film than in a film of silicon nitride or silicon oxynitride. The less stress occurs, the less likelihood there is that performance characteristics will be degraded by deformation of the substrate.

Figure 13:
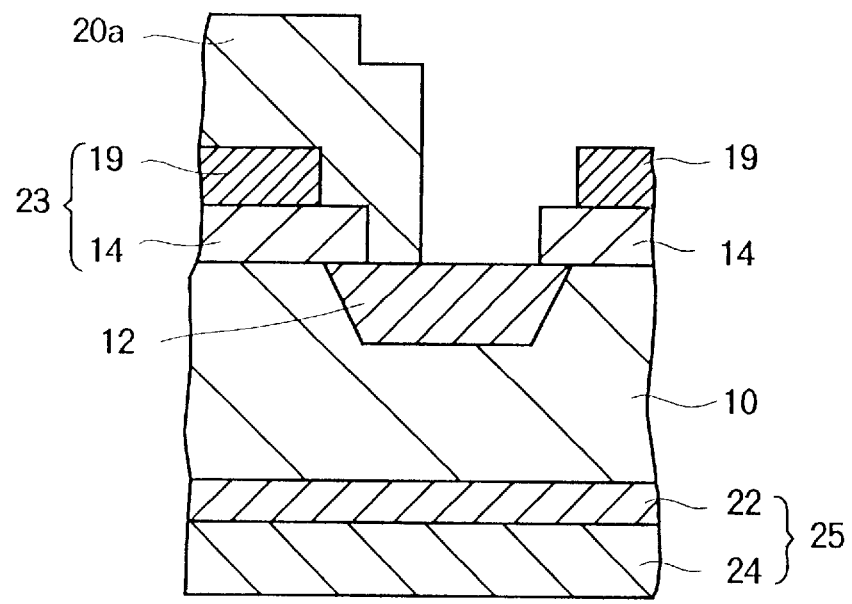
FIG. 13 is a sectional view of an LED in another novel LED array.

Next a third embodiment will be described. Referring to FIG. 13, in this embodiment the second insulating film 19 consists of a single silicon nitride film, with no PSG insulating film. Otherwise, the structure in FIG. 13 is identical to the structure in FIG. 1, and the same reference numerals are employed.

The fabrication method for this third embodiment is substantially identical to the fabrication method described above, except that no PSG insulating film 16 is deposited before the diffusion step illustrated in FIG. 7. Accordingly, no PSG insulating film has to be removed before the electrode formation step illustrated in FIG. 10.

Figure 14:
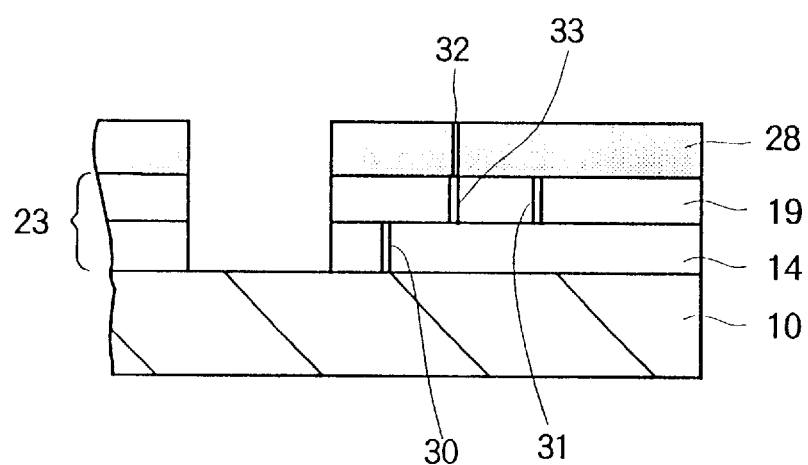
FIG. 14 is a sectional view of a novel LED array, illustrating pinholes.

FIG. 14 shows why the invention is effective in preventing pinholes from reaching the substrate 10. The second insulating film 19 is shown as comprising a single layer, and the accompanying description pertains to the third embodiment, but the same argument also applies to the first and second embodiments.

FIG. 14 illustrates a photolithography step used to pattern the second insulating film 19, showing the photoresist 28. Prior to etching, pinholes 30, 31, and 32 have formed at random locations in the first insulating film 14, second insulating film 19, and photoresist 28. None of these pinholes are mutually aligned. Since their locations are random, such non-alignment is to be expected.

During the etching process, etchant gas flows into the pinhole 32 in the photoresist 28 and etches an extension 33 of this pinhole through the second insulating film 19. Since this etchant does not attack the first insulating film 14, however, the extension 33 stops at the boundary between the first insulating film 14 and second insulating film 19. After the photoresist 28 is removed, there will be two pinholes 31 and 33 in the second insulating film 19, but neither of them is aligned with the pinhole 30 in the first insulating film 14, so no pinhole extends through both films.

Later, when the metal film is deposited, the pinholes 31 and 33 will be covered and partially or entirely filled with aluminum. When the aluminum is patterned to form the electrodes, the etchant may reach these pinholes 31 and 33 and begin etching down through them. The etchant may possibly even reach the first insulating film 14 and begin etching extensions of pinholes 31 and 33 in the first insulating film 14. Long before the etchant gets to the substrate 10, however, all necessary aluminum will have been removed from the wafer and the etching process will have been stopped. Accordingly, no pinhole extending through both the first and second insulating films 14 and 19 will be formed. Since no pinholes penetrate completely through the multilayer insulating film 23, the completed LED array will be free of short circuits.

Next the formation of the rounded patterns shown in FIG. 2 will be described, first for the case of a negative photoresist.

Figure 15:
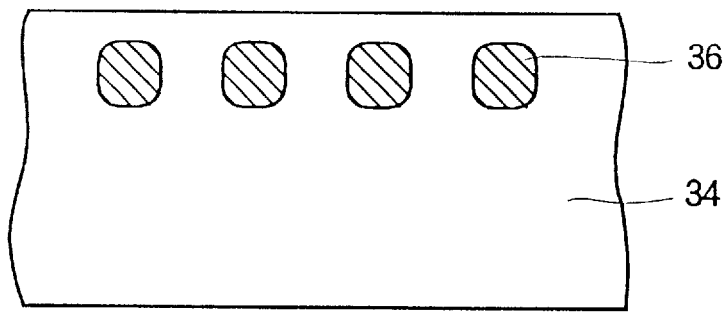
FIG. 15 illustrates a novel photomask for patterning the insulating film of the novel LED array.

FIG. 15 shows the photomask 34 used to pattern the first insulating film 14. This photomask 34 is generally transparent, but has opaque areas 36, the corners of which are rounded with a certain radius of curvature.

Figure 16:
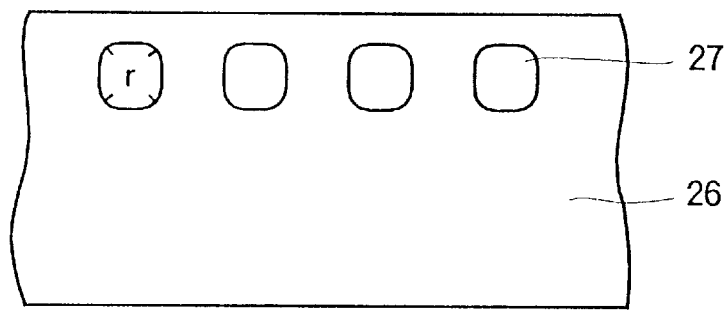
FIG. 16 illustrates the corresponding photoresist pattern.

Referring to FIG. 16, when the photoresist 26 is exposed to light through this photomask 34, then developed as described earlier, the photoresist areas that were masked by the opaque areas 36 and thus were not illuminated are dissolved, while other, illuminated areas remain intact; thus the windows 27 are formed. These windows 27 have the same shapes as the opaque areas 36 in the photomask; their corners have a certain radius of curvature, indicated in the drawing by the letter "r."

Figure 17:
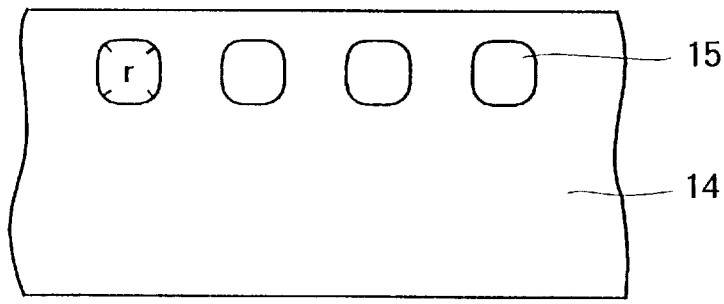
FIG. 17 illustrates the corresponding insulating film pattern.

Referring to FIG. 17, when the first insulating film 14 is etched to create the first windows 15, the same rounded corners are obtained again, with substantially the same radius of curvature "r." Since etchant does not pool in the rounded corners, a more uniformly etched pattern is obtained than in the prior art.

Figure 18:
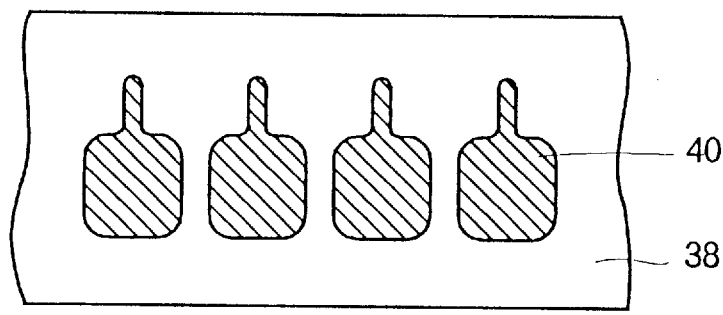
FIG. 18 illustrates a novel photomask for patterning the electrodes of the novel LED array.
Figure 19:
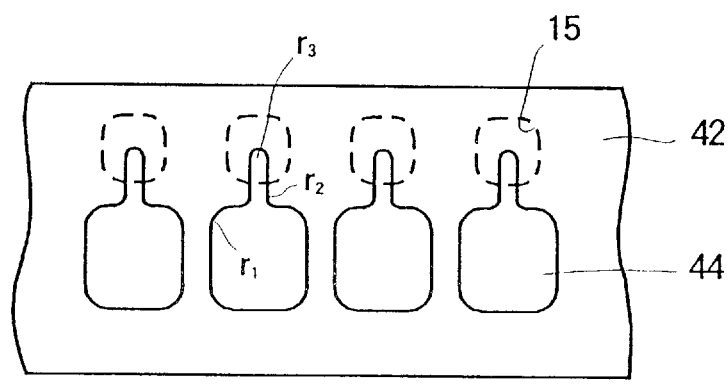
FIG. 19 illustrates the corresponding photoresist pattern.
Figure 20:
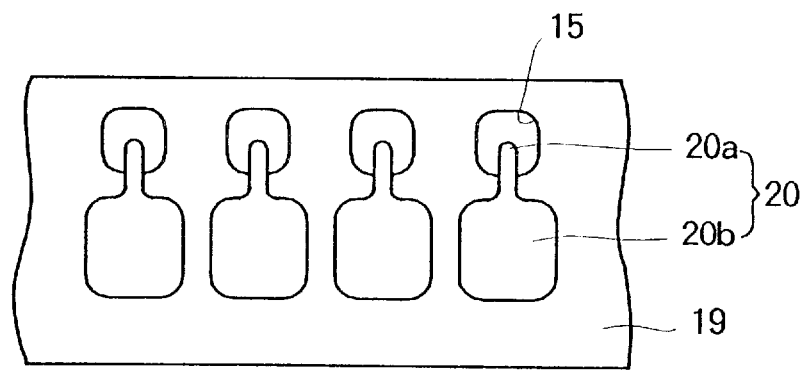
FIG. 20 illustrates the corresponding electrode pattern.

FIGS. 18, 19, and 20 show schematically how the rounded corners of the electrode patterns are obtained, this time using a positive photoresist. The photoresist is coated onto a layer of aluminum that is deposited on the entire wafer, as described in regard to FIG. 10.

FIG. 18 shows the photomask 38, which has opaque areas 40 in the desired shape of the electrodes. For simplicity the electrodes are shown with their bonding pads side by side, although of course the staggered arrangement illustrated in FIG. 2 is also possible.

FIG. 19 shows the photoresist 42 after exposure through the photomask 38 and chemical development. This time the areas 44 that were not illuminated light are left intact, while other, illuminated areas are dissolved. The symbols $r_1$, $r_2$, and $r_3$ indicate, respectively, the radius of curvature at corners of the bonding pads, the radius of curvature at the ends of the electrode leads, and the radius of curvature at the junctions between the bonding pads and electrode leads. The dotted lines indicate the positions of the first windows 15 that were formed earlier.

When the aluminum is etched using the photoresist 42 as an etching mask, electrodes 20 are formed as in FIG. 20, comprising bonding pads 20b and electrode leads 20a that extend through the first windows 15 to make contact with the diffusion regions below. The rounded corners assist the flow of etchant and prevent pooling, again leading to more uniform etching than in the prior art.

An effect of the more uniform etching is that the windows 15 all have the same size and the electrodes 20 all have the same shape, so all LEDs in the array emit the same amount of light. The electrodes 20 moreover faithfully reproduce their designed dimensions, enabling accurate control of their electrical resistance, and of their capacitance with respect to the common electrode 25.

Figure 21:
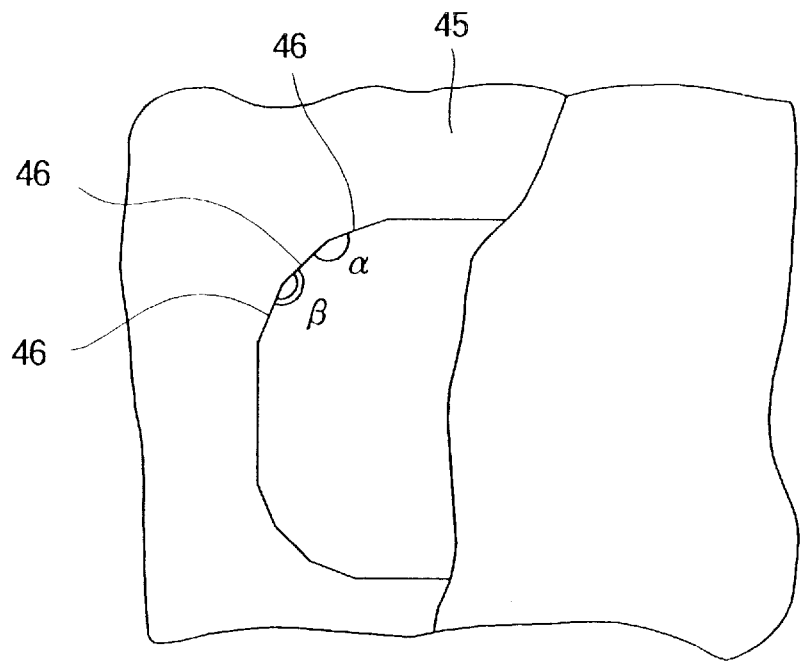
FIG. 21 illustrates part of another novel photomask for patterning the insulating film of the novel LED array.
Figure 22:
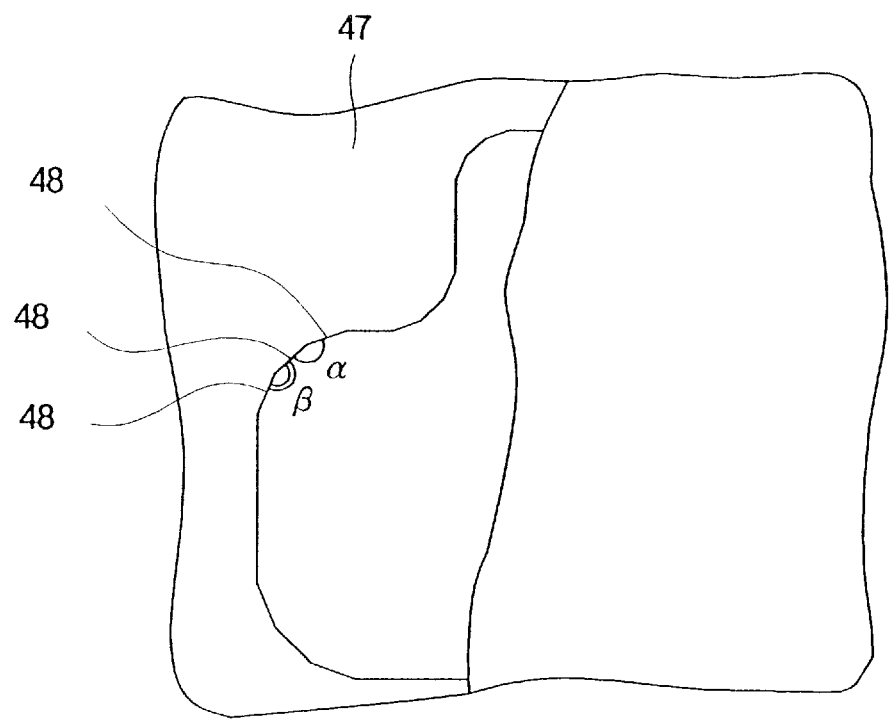
FIG. 22 illustrates part of another novel photomask for patterning the electrodes of the novel LED array.

If photomasks with truly rounded corners are difficult to make, substantially the same effect can be obtained by clipping the corners of the patterns with straight line segments. FIG. 21 shows part of a photomask 45 for the first windows 15 that has been formed in this way. Each corner consists of three straight line segments 46 that meet at obtuse angles α and β of about 157 degrees. Etchant will not tend to pool in angles of this size. FIG. 22 shows part of a photomask 47 for the electrode patterns. Again each corner consists of three line segments 48 meeting at obtuse angles α and β.

Instead of three line segments, it is possible to use two line segments meeting at an angle of about 150°, or one line segment which meets the sides of the pattern at angles of about 135°. The more line segments that are used, however, the better the effect becomes, because the pattern more closely approximates a truly rounded shape.

Eliminating pinholes that cause short circuits and sharp corners that cause non-uniform wet etching can greatly improve production yields. Experiments conducted by the inventors with conventional LED-array fabrication methods showed yield rates of about 70% to 80%. The invented fabrication method, however, has yielded high-quality LED arrays at a rate close to 100%.

The embodiments described above created pn junctions by diffusing a p-type impurity into an n-type substrate, but the invention can also be practiced by diffusing an n-type impurity into a p-type substrate, forming n-type diffusion regions. The electrodes making contact with the n-type diffusion regions should then comprise gold or a gold alloy, while the common electrode making contact with the p-type substrate should comprise aluminum or an aluminum alloy.

Those skilled in the art will recognize that the fabrication methods described above can be modified in various ways without departing from the scope of the invention as claimed below.

What is claimed is:

1. A method of fabricating an LED array, comprising:
   a. forming a first insulating film comprised of aluminum oxide on a semiconductor substrate of a first conductive type;
   b. patterning said first insulating film by photolithography to form a plurality of first windows;
   c. diffusing an impurity of a second conductive type through said plurality of first windows into said first insulating film, thereby forming a plurality of diffusion regions of said second conductive type below said plurality of first windows;
   d. forming a second insulating film on said first insulating film and said plurality of first windows;
   e. patterning said second insulating film by photolithography to remove said second insulating film from said plurality of first windows, using an etchant that does not etch said first insulating film;
   f. forming a metal film on said second insulating film and said plurality of first windows; and
   g. patterning said metal film by photolithography to form a plurality of electrodes which make electrical contact with respective diffusion regions.

2. The method of claim 1, wherein said impurity of said first conductive type is n-type, and wherein said impurity of said second conductive type is p-type.

3. The method of claim 2, wherein said impurity of said second conductive type is p-type and is zinc.

4. The method of claim 1, wherein said impurity of said first conductive type is p-type, and wherein said impurity of said second conductive type is n-type.

5. The method of claim 1, wherein said second insulating film comprises silicon nitride, and patterning in step (e) of said second insulating film is carried out by dry etching.

6. The method of claim 1, wherein said second insulating film comprises silicon oxynitride, and patterning in step (e) of said second insulating film is carried out by dry etching.

7. The method of claim 1, wherein said second insulating film comprises a PSG insulating film which is formed before diffusing in step (c), which protects said semiconductor substrate during diffusing, and which is patterned after diffusing.

8. The method of claim 7, wherein patterning in step (e) of said second insulating film employs, as said etchant, buffered hydrofluoric acid.

9. The method of claim 7, wherein said second insulating film further comprises an upper insulating film which is formed after diffusing in step (c), but before said PSG insulating film is patterned in step (e) by photolithography.

10. The method of claim 9, wherein patterning in step (e) of said second insulating film includes patterning said upper insulating film by dry etching to provide a patterned upper insulating film and using said patterned upper insulating film as an etching mask for patterning said PSG film.

11. The method of claim 10, wherein said upper insulating film is patterned by plasma etching with etchant gases comprising carbon tetrafluoride and oxygen.

12. The method of claim 10, wherein said upper insulating film comprises silicon nitride.

13. The method of claim 10, wherein said upper insulating film comprises silicon oxynitride.

14. The method of claim 9, wherein said upper insulating film is patterned by an etchant which does not etch said PSG insulating film so that said etchant cannot reach said first insulating film, and therefore does not etch said first insulating film.

15. The method of claim 14, wherein said upper insulating film comprises aluminum oxide.

16. The method of claim 15, wherein said upper insulating film is patterned by using hot phosphoric acid as said etchant.

* * * * *